US012484292B2

(12) United States Patent
Lee et al.

(10) Patent No.: US 12,484,292 B2
(45) Date of Patent: Nov. 25, 2025

(54) METHODS OF REDUCING PARASITIC CAPACITANCE IN SEMICONDUTOR DEVICES

(71) Applicant: Taiwan Semiconductor Manufacturing Co., Ltd., Hsin-Chu (TW)

(72) Inventors: Kai-Hsuan Lee, Hsinchu (TW); Feng-Cheng Yang, Hsinchu County (TW); Yen-Ming Chen, Hsin-Chu County (TW); Sai-Hooi Yeong, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/738,707

(22) Filed: Jun. 10, 2024

(65) Prior Publication Data
US 2024/0332084 A1 Oct. 3, 2024

Related U.S. Application Data

(60) Continuation of application No. 17/350,177, filed on Jun. 17, 2021, now Pat. No. 12,009,263, which is a (Continued)

(51) Int. Cl.
*H01L 21/8234* (2006.01)
*H01L 21/285* (2006.01)
(Continued)

(52) U.S. Cl.
CPC ..... *H10D 84/038* (2025.01); *H01L 21/28518* (2013.01); *H01L 21/31055* (2013.01);
(Continued)

(58) Field of Classification Search
CPC .......... H01L 21/8264; H01L 21/28518; H01L 27/088
See application file for complete search history.

(56) References Cited

U.S. PATENT DOCUMENTS 8,772,109 B2  7/2014  Colinge
8,785,285 B2  7/2014  Tsai et al.
(Continued)

*Primary Examiner* — Dale E Page
*Assistant Examiner* — Wilner Jean Baptiste
(74) *Attorney, Agent, or Firm* — HAYNES AND BOONE, LLP

(57) ABSTRACT

A method includes providing a workpiece including a gate structure (MG), a first spacer along a sidewall of the MG, a second spacer along a sidewall of the first spacer, and a source/drain (S/D) feature adjacent to the second spacer. The method further includes forming a contact trench over the S/D feature, removing the second spacer to form an air gap between the MG and the S/D feature, depositing a first dielectric layer over the S/D feature and partially filling the air gap, removing a portion of the first dielectric layer to expose a central portion of a top surface of the S/D feature while a side portion of the top surface of the S/D feature remains under the first dielectric layer, forming an S/D contact in the contact trench, removing the first dielectric layer to extend the air gap, and depositing a second dielectric layer over the air gap.

20 Claims, 11 Drawing Sheets

Related U.S. Application Data division of application No. 16/399,553, filed on Apr. 30, 2019, now Pat. No. 11,043,425.

(60) Provisional application No. 62/725,403, filed on Aug. 31, 2018.

(51) Int. Cl.

| | |
|---|---|
| *H01L 21/3105* | (2006.01) |
| *H01L 21/764* | (2006.01) |
| *H01L 27/088* | (2006.01) |
| *H10D 30/62* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ............ *H01L 21/764* (2013.01); *H10D 30/62* (2025.01); *H10D 62/115* (2025.01); *H10D 64/015* (2025.01); *H10D 84/013* (2025.01); *H10D 84/0135* (2025.01); *H10D 84/0147* (2025.01); *H10D 84/0149* (2025.01); *H10D 84/0151* (2025.01); *H10D 84/0158* (2025.01); *H10D 84/834* (2025.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,536,982 B1 * | 1/2017 | Cheng .................. H01L 21/31 |
| 9,576,814 B2 | 2/2017 | Wu et al. |
| 9,716,158 B1 | 7/2017 | Cheng et al. |
| 2019/0172752 A1 * | 6/2019 | Hsu .................. H10D 84/0135 |
| 2019/0312123 A1 | 10/2019 | Cheng |

* cited by examiner

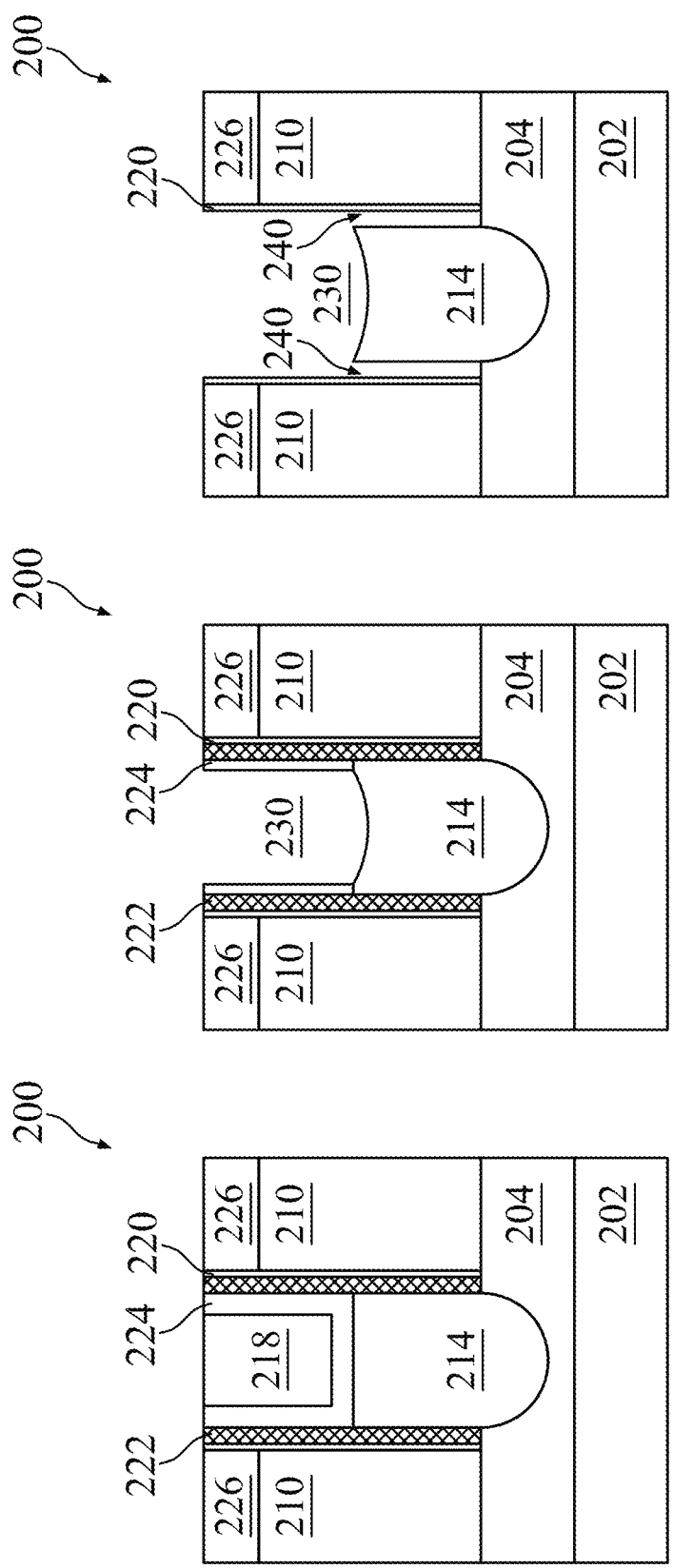

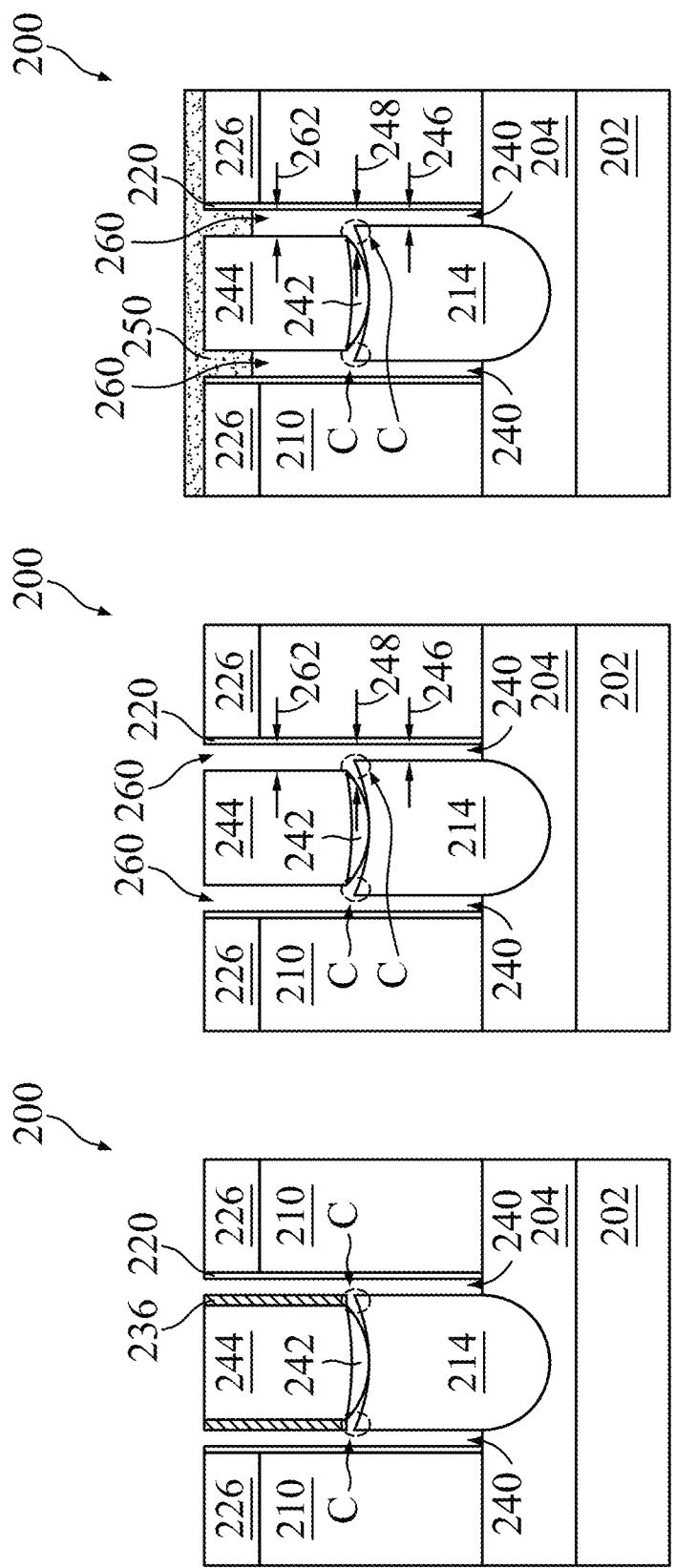

METHODS OF REDUCING PARASITIC CAPACITANCE IN SEMICONDUTOR DEVICES

CROSS-REFERENCE TO RELATED APPLICATIONS

This is a continuation application of U.S. patent application Ser. No. 17/350,177, filed Jun. 17, 2021, which is a divisional application of U.S. patent application Ser. No. 16/399,553, filed Apr. 30, 2019, which claims priority to U.S. Provisional Patent Application Ser. No. 62/725,403, filed Aug. 31, 2018, each of which is hereby incorporated by reference in its entirety.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

For example, many methods have been developed to introduce structural features to fin-like FETs (FinFETs) for improved device performance, such as, for example, reduced parasitic capacitance between conductive features in FinFETs. While these methods have generally been adequate, they have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8A, 8B, 9, 10A, 10B, 11A, 11B, 11C, 12A, 12B, 12C, 12D, and 12E are cross-sectional views.

DETAILED DESCRIPTION

Figure 1A:
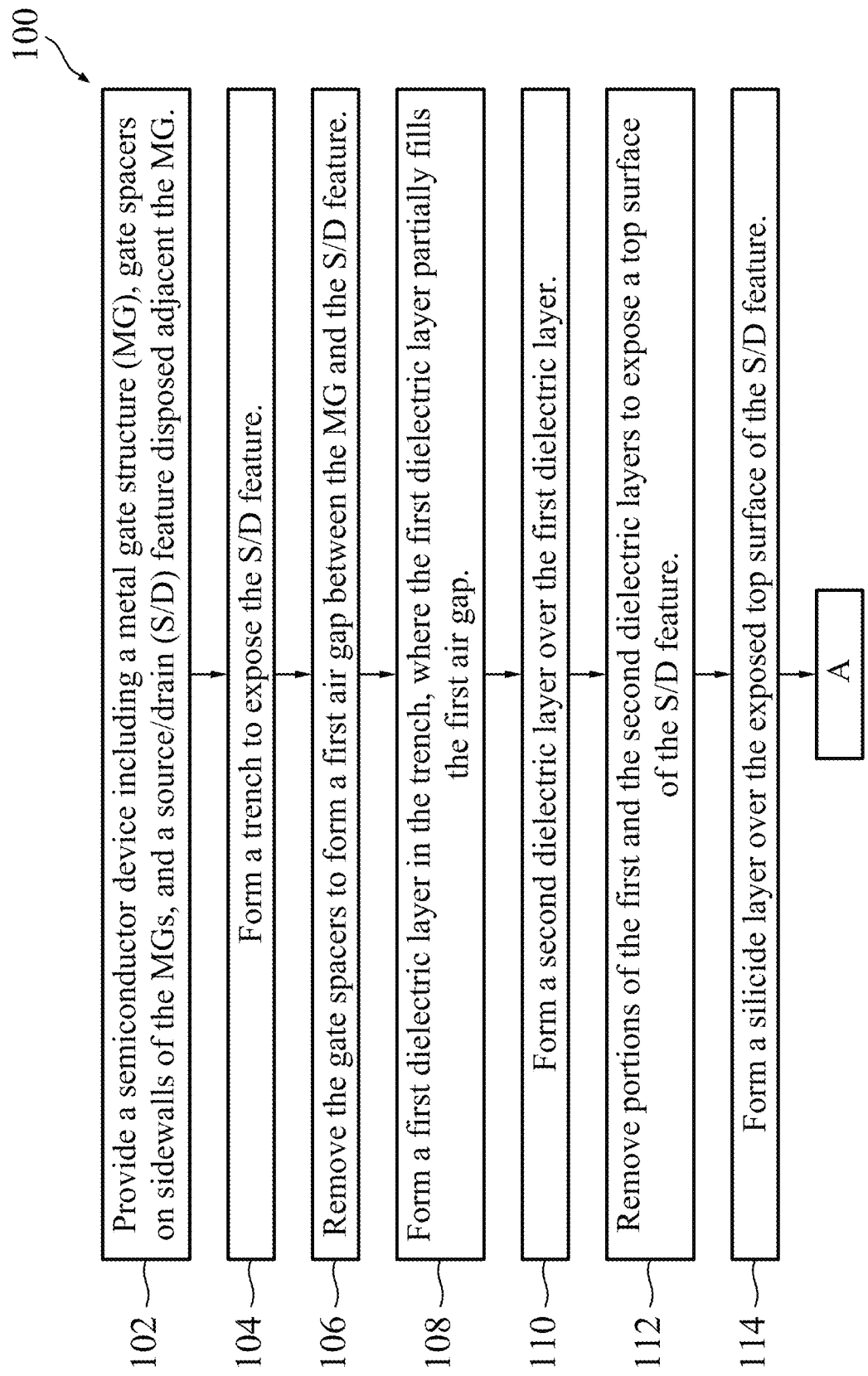
FIGS. 1A and 1B illustrate a flowchart of an example method for fabricating a semiconductor device, according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods thereof, and more particularly to the formation of air gaps between source/drain (S/D) contacts and neighboring metal gate structures. As FinFET technologies progress towards smaller technology nodes (such as 16 nm, 10 nm, 7 nm, 5 nm, and below), decreasing fin pitch places significant constraints on materials that can be used between metal gate structures and neighboring S/D contacts connected to S/D features. In many instances, to lower or minimize parasitic capacitance, insulating (or dielectric) materials with relatively low dielectric constants (k), such as low-k dielectrics and/or air (by forming an air gap, for example), may be incorporated between various conductive features in a semiconductor device. While air gaps have been generally adequate in lowering parasitic capacitance, they may be prone to be damaged by the subsequent formation of S/D contacts. For example, when forming a S/D contact, overlay shift may occur if a mask for patterning the S/D contact is not aligned precisely with the underlying S/D features. As a result, the position of a contact trench (or a contact hole) may be too close to a neighboring metal gate structure, potentially exposing an already-sealed air gap during a subsequent etching process. Consequently, the exposed air gap may be partially or completely filled by a conductive material deposited to form the S/D contact. For these and other reasons, improvements in methods of forming air gaps are desired.

Figure 1B:
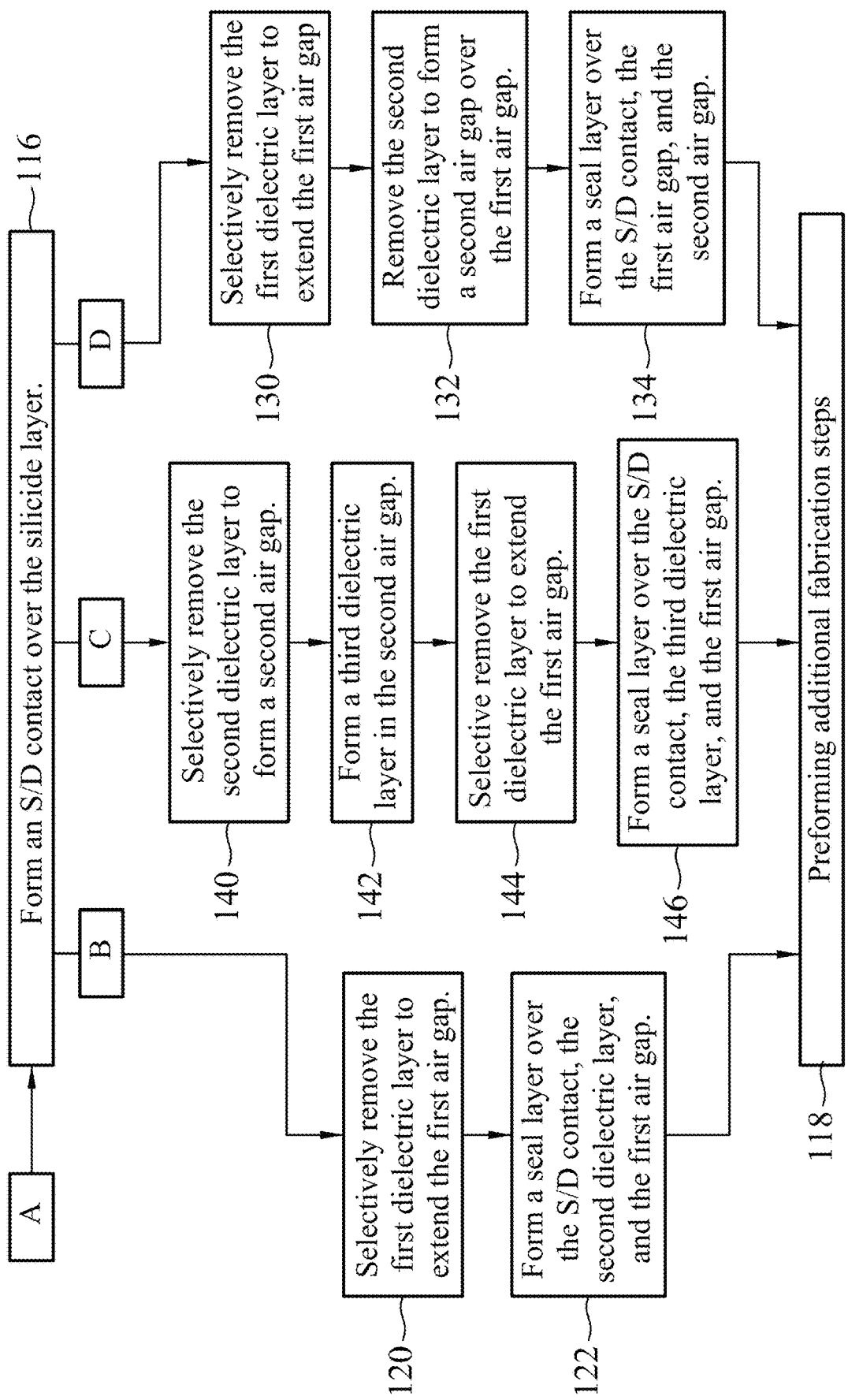

Referring now to FIGS. 1A and 1B, a flowchart of a method 100 of forming a semiconductor device 200 (hereafter simply referred to as the device 200) is illustrated according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 2A-12G, which illustrate a portion of the device 200 during method 100. FIGS. 3-12E are cross-sectional views of the device 200 taken along the dashed line AA' shown in FIGS. 2A and 2B at intermediate steps of method 100. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices. Additional features can be added in semiconductor device 200, and some of the features described below can be replaced, modified, or eliminated in other embodiments of semiconductor device 200.

Figures 2A, 2B:
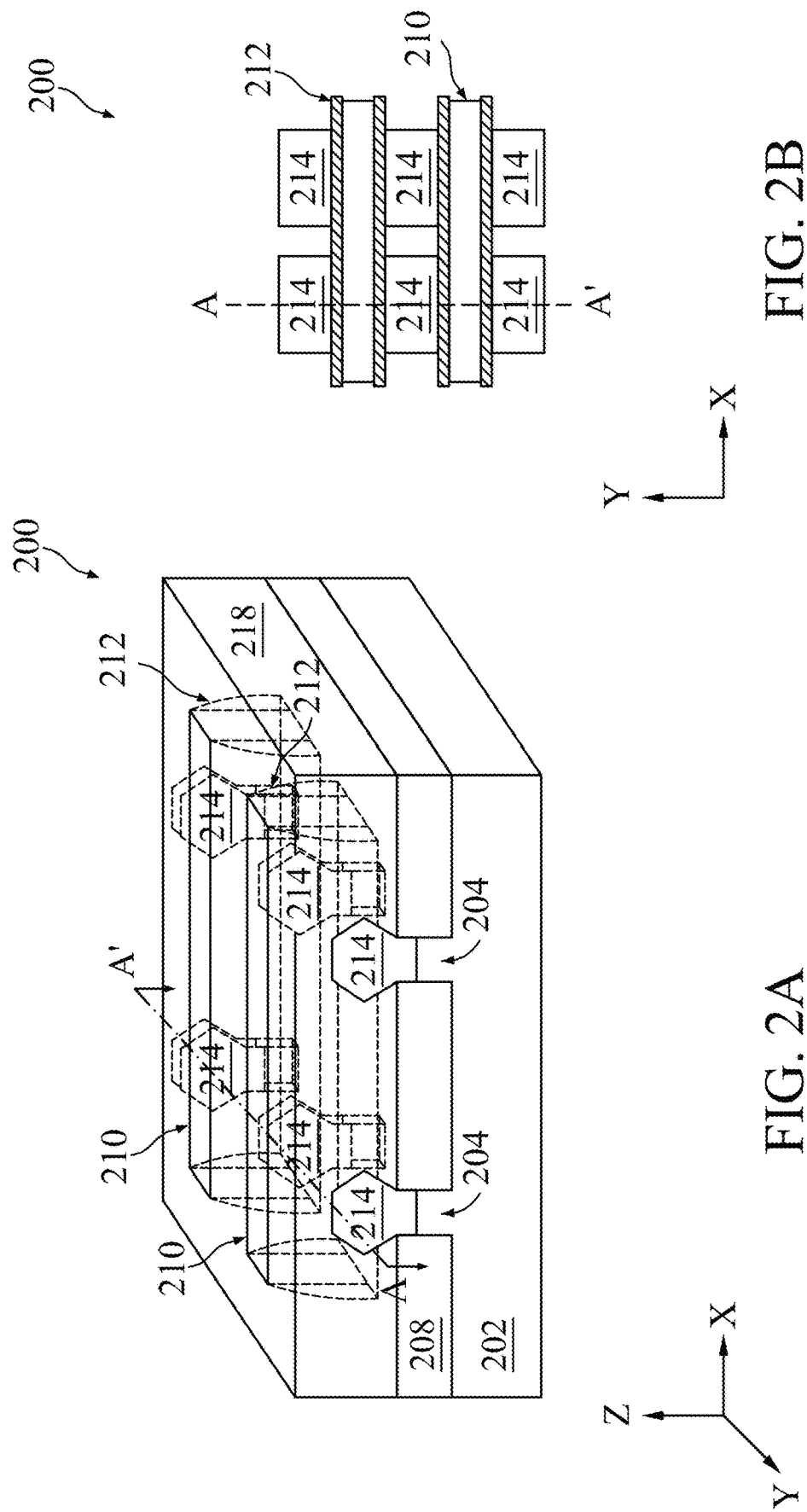
FIG. 2A is a three-dimensional perspective view of an example semiconductor device, according to various embodiments of the present disclosure.
FIG. 2B is a planar top view of the semiconductor device shown in FIG. 2A, according to various embodiments of the present disclosure.

At operation 102, referring to FIGS. 1A, 2A, and 2B, method 100 provides, or is provided with, the device 200 that includes a substrate 202 having at least one semiconductor layer 204 (e.g., an active region such as a three-dimensional fin; hereafter referred to as a fin 204) disposed thereon, a high-k metal gate (HKMG) structure 210 disposed over the fin 204, isolation structures 208 disposed over the substrate 202 separating various components of the device 200, source/drain (S/D) features 214 disposed over the fin 204 and interposing HKMG structures 210 as depicted in a top view in FIG. 2B. "High-k," as used herein, refers to a dielectric material having a dielectric constant greater than that of silicon oxide, which is approximately 3.9. As depicted herein, the device 200 may include multiple fins 204 oriented lengthwise along the Y direction and multiple HKMG structures 210 oriented lengthwise along the X direction, i.e., generally perpendicular to the fins 204. Referring to FIG. 3, the device 200 includes additional features such as gate spacers 212 (which may include more than one gate spacer layer, e.g., gate spacers 220 and gate spacers 222, as discussed in detail below) disposed on sidewalls of the HKMG structures 210, hard mask layer 226 disposed over the HKMG structures 210, a contact etch-stop layer (CESL) 224 disposed over the S/D features 214, and numerous other features. For purpose of simplicity, intermediate steps of method 100 are hereafter described with reference to cross-sectional views (FIGS. 4-12E) of the device 200 taken along a length of the fin 204 (i.e., the dashed line AA' in the Y direction), as well as perspective view FIG. 12F and top view FIG. 12G.

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are disposed in or on the substrate 202. The doped regions may be doped with n-type dopants, such as phosphorus or arsenic, and/or p-type dopants, such as boron, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2A and 2B, the device 200 includes source/drain (S/D) features 214 disposed over the fins 204 and adjacent to the HKMG structure 210. The S/D features 214 may be formed by any suitable techniques, such as etching processes followed by one or more epitaxy processes. In one example, one or more etching processes are performed to remove portions of the fins 204 to form recesses (not shown) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the S/D features 214 may be suitable for a p-type FinFET device (e.g., including a p-type epitaxial material) or alternatively, an n-type FinFET device (e.g., including an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant.

The device 200 further includes the HKMG structures 210 disposed over a portion of the fins 204, such that they interpose S/D features 214. Each HKMG structure 210 includes a high-k (i.e., having a dielectric constant greater than that of silicon oxide; not depicted) dielectric layer (not depicted) disposed over the fins 204 and a metal gate electrode (not depicted) disposed over the high-k dielectric layer. The metal gate electrode may further include at least one work function metal layer and a bulk conductive layer disposed thereover. The work function metal layer may be a p-type or an n-type work function metal layer. Exemplary work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include copper (Cu), tungsten (W), aluminum (Al), cobalt (Co), other suitable materials, or combinations thereof. The HKMG structures 210 may further include numerous other layers (not depicted), such as an interfacial layer disposed between the fins 204 and the high-k dielectric layer, capping layers, barrier layers, other suitable layers, or combinations thereof. In the depicted embodiment, for example, the HKMG structures 210 further include hard mask layer 226 disposed thereover. The hard mask layer 226 may include any suitable dielectric material, such as silicon oxide, silicon nitride, silicon oxynitride, other suitable materials, or combinations thereof. Various layers of the HKMG structure 210 may be deposited by any suitable method, such as chemical oxidation, thermal oxidation, atomic layer deposition (ALD), CVD, physical vapor deposition (PVD), plating, other suitable methods, or combinations thereof.

In some embodiments, the device 200 includes gate spacers 220 and gate spacers 222 (collectively referred to as the gate spacers 212 in FIGS. 2A and 2B) disposed on sidewalls of the HKMG structures 210. In some embodiments, each of the gate spacers 220 and gate spacers 222 include one or more of the following elements: silicon, oxygen, nitrogen, and carbon. For example, each of the gate spacers 220 and gate spacers 222 may include a dielectric material such as silicon oxide, silicon nitride, silicon carbide, silicon oxynitride, silicon oxycarbide, other suitable dielectric materials, or combinations thereof. Notably, the present disclosure provides that compositions of the gate spacers 220 and gate spacers 222 are different, such that they may be etched at different rates when subjected to a specific etchant. In one such example, the gate spacers 220 may include a combination of silicon, oxygen, and nitrogen (e.g., $SiO_xN_y$, where x and y correspond to stoichiometric ratios of O to N), and the gate spacers 222 may include a combination of silicon, oxygen, and carbon (e.g., $SiO_xC_y$, where x and y correspond to stoichiometric ratios of O to C). The gate spacers 220 and gate spacers 222 may each be a single layered structure or a multi-layered structure. The gate spacers 220 may be formed by first depositing a blanket of spacer material over the device 200, and then performing an anisotropic etching process to remove portions of the spacer material to form the gate spacers 220 on sidewalls of the HKMG structures 210. Thereafter, the gate spacers 222 are formed over the gate spacers 220 in a similar manner.

In some embodiments, still referring to FIG. 3, the HKMG structures 210 are formed after other components of the device 200 (e.g., the S/D features 214) are fabricated. Such process is generally referred to as a gate replacement process, which includes forming a dummy gate structure (not depicted) as a placeholder for the HKMG structures 210, forming the S/D features 214, forming the CESL 224 over the S/D features 214, forming an interlayer dielectric (ILD) layer 218 over the dummy gate structure and the S/D features 214, planarizing the ILD layer 218, for example, by CMP, to expose a top surface of the dummy gate structure, removing the dummy gate structure to form a trench that exposes channel regions of the fins 204, and forming the HKMG structures 210 in the trench to complete the gate replacement process. Thereafter, a polishing process, such as chemical mechanical polishing (CMP), may be performed to remove excess materials from a top surface of the HKMG structure 210 to planarize a top surface of the device 200. In some embodiments, the ILD layer 218 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In the depicted embodiment, the ILD layer 218 includes an oxide-containing dielectric material. The ILD layer 218 may include a multi-layer structure or a single-layer structure and may be formed by a deposition process such as, for example, CVD, flowable CVD (FCVD), spin-on-glass (SOG), other suitable methods, or combinations thereof. The CESL 224 may include silicon nitride, silicon oxynitride, silicon nitride with oxygen or carbon elements, other suitable materials, or combinations thereof, and may be formed by CVD, PVD, ALD, other suitable methods, or combinations thereof.

Referring to FIGS. 1A and 4, method 100 at operation 104 removes the portion of the ILD layer 218 disposed over the S/D features 214 and a bottom portion of the CESL 224 to expose the S/D features 214 in a trench 230 (i.e., an S/D contact trench). In some embodiments, method 100 at operation 104 implements a suitable etching process to anisotropically remove the dielectric materials (e.g., the ILD layer 218 and the CESL 224) disposed over the S/D features 214. In other words, the etching process at operation 104 substantially etches the ILD layer 218 and the CESL 224, while the S/D features 214 is not etched or only minimally etched. As depicted herein, portions of the CESL 224 disposed on the gate spacers 222 remain in the device 200 after implementing the etching process at operation 104. In an example embodiment, method 100 implements a dry etching process using an etchant including a fluorine-containing gas (e.g., $CF_4$, $SF_6$, $CH_2F_2$, $CHF_3$, and/or $C_2F_6$), hydrogen (i.e., $H_2$), other suitable gases, or combinations thereof. As depicted herein, the etching process at operation 104 may inadvertently, though only minimally, remove a portion of the S/D features 214, such that the top surface of the S/D features 214 adopts a concaved configuration. Of course, the present disclosure is not limited to such configuration.

Referring to FIGS. 1A and 5, method 100 at operation 106 removes the remaining portions of the CESL 224 and the gate spacers 222 to form an air gap 240, portions of which are disposed between the HKMG structures 210 and the S/D features 214. In an example embodiment, a width of the air gap 240 between the gate spacers 220 and the S/D features 214 may be less than or equal to about 5 nm. Of course, the present disclosure is not limited to such dimension. In some embodiments, method 100 at operation 106 selectively removes the remaining portions of the CESL 224 and the gate spacers 222 relative to other components of the device 200, including the gate spacers 220 and the S/D features 214. In other words, the etching process at operation 106 substantially removes the CESL 224 and the gate spacers 222, while the other components are minimally etched or not etched at all. In some embodiments, method 100 at operation 106 implements an anisotropic, dry etching process using an etchant such as gaseous hydrofluoric acid (i.e., HF) to remove the remaining portions of the CESL 224 and the gate spacers 222. Alternatively, the remaining portions of the CESL 224 and the gate spacers 222 may be removed by a dry etching process (e.g., an ashing process) followed by a wet etching process using, for example, diluted HF (DHF) as the etchant.

Figure 6:
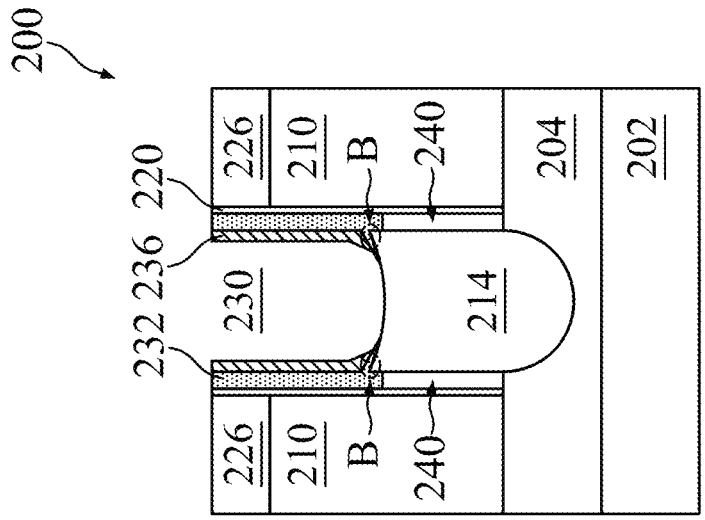

Referring to FIGS. 1A and 6, method 100 at operation 108 forms a dielectric layer 232 in the trench 230 and in the air gap 240. In other words, the dielectric layer 232 is formed over the top surface of the S/D features 214 and on portions of the gate spacers 220, which also partially fills the air gap 240. In some embodiments, method 100 at operation 108 also forms the dielectric layer 232 over the HKMG structures 210 (and/or the hard mask layer 226). In some embodiments, the dielectric layer 232 includes silicon, oxygen, nitrogen, carbon, other suitable materials, or combinations thereof. In an example embodiment, the dielectric layer 232 includes amorphous silicon. In some embodiments, the dielectric layer 232 includes a greater amount of silicon than the gate spacers 220 to achieve etching selectivity as discussed in detail below. The dielectric layer 232 may be deposited using any suitable method, such as ALD, CVD, PVD, other suitable methods, or combinations thereof. In an example embodiment, the dielectric layer 232 is deposited using ALD. In some embodiments, the dielectric layer 232 is configured to accommodate the formation of an additional air gap in the device 200 as will be discussed in detail below.

In some embodiments, due to the narrow width of the air gap 240, the deposition of the dielectric layer 232 does not completely fill the air gap 240. Instead, as depicted herein, the dielectric layer 232 partially fills the air gap 240, such that portions A of the dielectric layer 232 may be formed between the S/D features and the gate spacers 220 (and, in some embodiments, extend below the top surface of the S/D features 214). In one example, the portions A may measure less than about 5 nm in height (i.e., along the Z direction). In another example, the height of the portions A may be similar to the width of the air gap 240 disposed between the gate spacers 220 and the S/D features 214, such as, for example, about 5 nm. Of course, the dimensions of the portions A are not limited to that depicted in FIG. 6.

Still referring to FIGS. 1A and 6, in some embodiments, method 100 at operation 110 forms a dielectric layer 236 over the dielectric layer 232 in the trench 230 and over the HKMG structures 210 (and/or the hard mask layer 226). In some embodiments, the dielectric layer 236 is deposited conformally over the dielectric layer 232. Notably, although the dielectric layer 236 may also include silicon, oxygen, nitrogen, carbon, other suitable materials, or combinations thereof, its composition differs from that of the dielectric layer 232 such that an etching selectivity exists between them. In the depicted embodiment, the dielectric layer 236 includes a greater amount of nitrogen than the dielectric layer 232, while the dielectric layer 232 includes a greater amount of silicon than the dielectric layer 236. For example, the dielectric layer 232 may include amorphous silicon while the dielectric layer 236 may include silicon nitride. Similar to the forming of the dielectric layer 232, the dielectric layer 236 may be formed by any suitable method, such as ALD, CVD, PVD, other suitable methods, or combinations thereof. In the depicted embodiment, the dielectric layer 236 is formed by an ALD process. Depending upon specific design requirements, the dielectric layer 236 may be omitted from the device 200. But if included, the dielectric layer 236 is configured to block thermal re-flow of certain conductive materials (e.g., Co) used to form an S/D contact over the S/D features 214 into other portions of the device 200 after thermal treatment. Additionally, the dielectric layer 236 may be configured to protect the dielectric layer 232 during subsequent fabrication processes (e.g., forming a silicide layer).

Notably, the dielectric layer 232 and dielectric layer 236 are not formed to any particular thicknesses so long as each of the dielectric layer 232 and dielectric layer 236 is deposited to a thickness of about 1 nm to about 3 nm at operations 108 and 110, respectively. In fact, thicknesses of the dielectric layer 232 and dielectric layer 236 may be tuned to various values depending upon specific design requirements, such as a critical dimension (CD) of the subsequently formed S/D contact. In one such example, if the CD of the S/D contact is about 18 nm, then the sum of the thicknesses of the dielectric layer 232 and/or dielectric layer 236 may not exceed about 5 nm. In the present disclosure, such minimum thickness value is required for the dielectric layer 232 and dielectric layer 236 because of the specific functions they serve during the fabrication process as discussed above.

In alternative embodiments (not depicted), instead of forming two dielectric layers (i.e., the dielectric layer 232 and dielectric layer 236), method 100 implements operation 108 to form the dielectric layer 232 but omits forming the dielectric layer 236 at operation 110. As such, the dielectric layer 232 may function as a dummy layer for accommodating the subsequent formation of the S/D contact, as a blocking layer for preventing thermal re-flow of the conductive material included in the S/D contact, or both, depending upon the specific material included therein. In one such example, the dielectric layer may include aluminum, oxygen, and nitrogen in the form of, for example, aluminum oxynitride ($AlO_xN_y$, where x and y correspond to stoichiometric ratios of O to N). In some examples, if y is greater than x, the aluminum oxynitride-containing layer may function as a blocking layer. In other examples, if y is less than x, the aluminum oxynitride-containing layer may function as a dummy layer.

Figure 7:
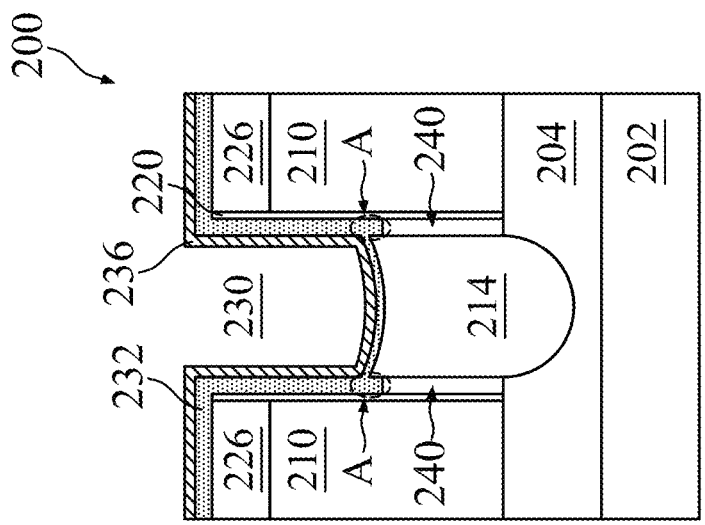

Referring to FIGS. 1A and 7, method 100 at operation 112 removes portions of the dielectric layer 232 and dielectric layer 236 to expose the top surface of the S/D features 214. In some embodiments, method 100 performs an anisotropic etching process to remove the portions of the dielectric layer 232 and dielectric layer 236 disposed over the HKMG structures 210 (and/or the hard mask layer 226) and over the S/D features 214, while portions of the dielectric layer 232 and dielectric layer 236 disposed on sidewalls of the trench 230 are minimally etched or not etched at all. In the present embodiment, portions B of the dielectric layer 232 remain over the top surface of the S/D features 214 after the etching process at operation 112. This may be due to the fact that portions of the dielectric layer 232 corresponding to the portions B as shown in FIG. 7 are not exposed to sufficient amount of etchant during the etching process at operation 112. In some embodiments, it is possible that a minute portion of the top surface of the S/D features 214 is removed by the etching process at operation 112; however, the total loss of the S/D features 214 during the implementation of method 100 does not exceed about 3 nm in depth and may be controlled by adjusting various etching parameters. The etching process at operation 112 may be implemented by any suitable method, such as a dry etching process, a wet etching process, RIE, other suitable processes, or combinations thereof. In the present embodiment, the etching process may be an anisotropic dry etching process implementing an etchant including a fluorine-containing gas (e.g., $CF_4$, $SF_6$, $CH_2F_2$, $CHF_3$, and/or $C_2F_6$), hydrogen (i.e., $H_2$), other suitable gases, or combinations thereof.

Figures 8A, 8B:
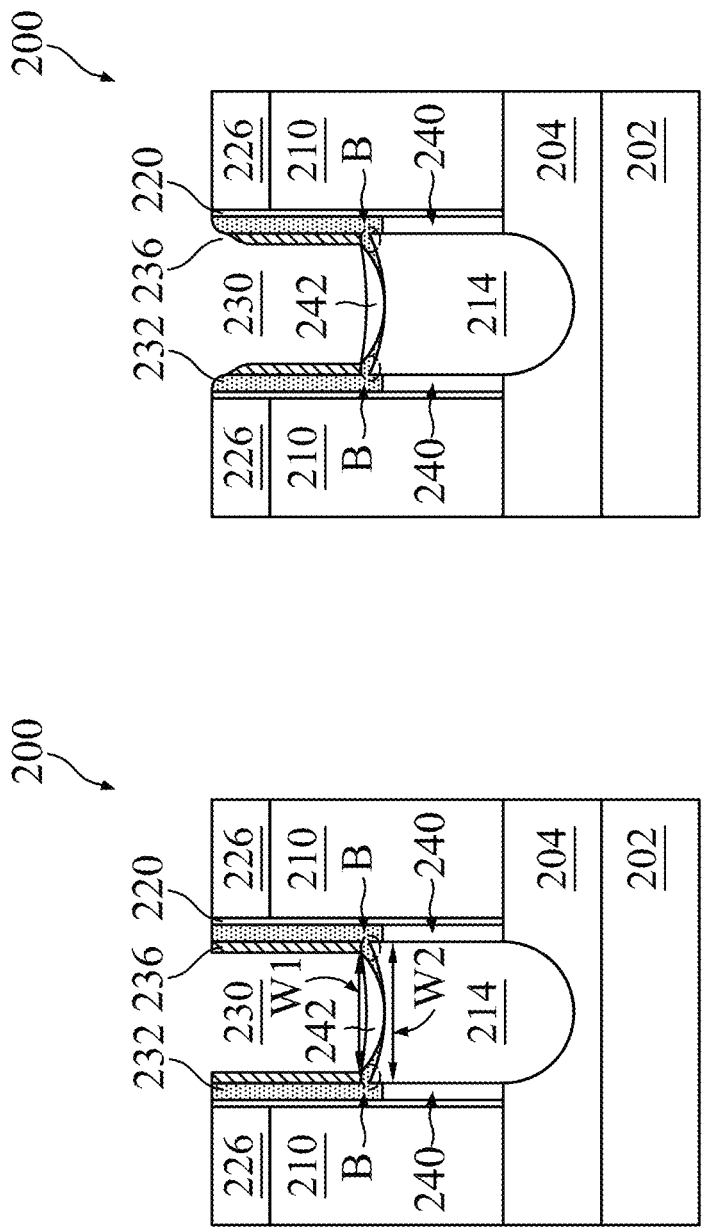

Referring to FIGS. 1A, 8A, and 8B, method 100 at operation 114 forms a silicide layer 242 over the exposed S/D features 214. In some embodiments, the silicide layer 242 includes nickel silicide, cobalt silicide, tungsten silicide, tantalum silicide, titanium silicide, platinum silicide, erbium silicide, palladium silicide, other suitable silicide, or combinations thereof. The silicide layer 242 may be formed over the device 200 by a deposition process such as CVD, ALD, PVD, other suitable processes, or combinations thereof. For example, a metal layer (e.g., titanium) may be deposited over the S/D features 214, and the device 200 is annealed to allow the metal layer and the semiconductor materials of the S/D features 214 to react. Thereafter, the un-reacted metal layer is removed, leaving the silicide layer 242 over the S/D features 214. Alternatively, the silicide layer 242 may be deposited directly over the S/D features 214 by a suitable deposition process. In some embodiments, as depicted herein, because of the portions B remaining after etching the dielectric layer 232, a width W1 of the silicide layer 242 defined between the dielectric layer 236 (or the dielectric layer 232 if the dielectric layer 236 is omitted) is less than a width W2 of the S/D features 214 defined between the air gap 240.

Referring to FIG. 8A, no additional etching process is performed after forming the silicide layer 242 at operation 114. In contrast, referring to FIG. 8B, an additional dry etching process may be performed after forming the silicide layer 242. Specifically, the additional dry etching process preferentially removes a top portion of the dielectric layer 236 relative to the dielectric layer 232 and the silicide layer 242, such that the dielectric layer 236 is configured to have a rounded profile as depicted. In some embodiments, the rounded profile helps accommodate the subsequent formation of the S/D contact, e.g., efficient filling of a conductive material (e.g., Co) in the trench 230.

Figures 9, 10A, 10B:
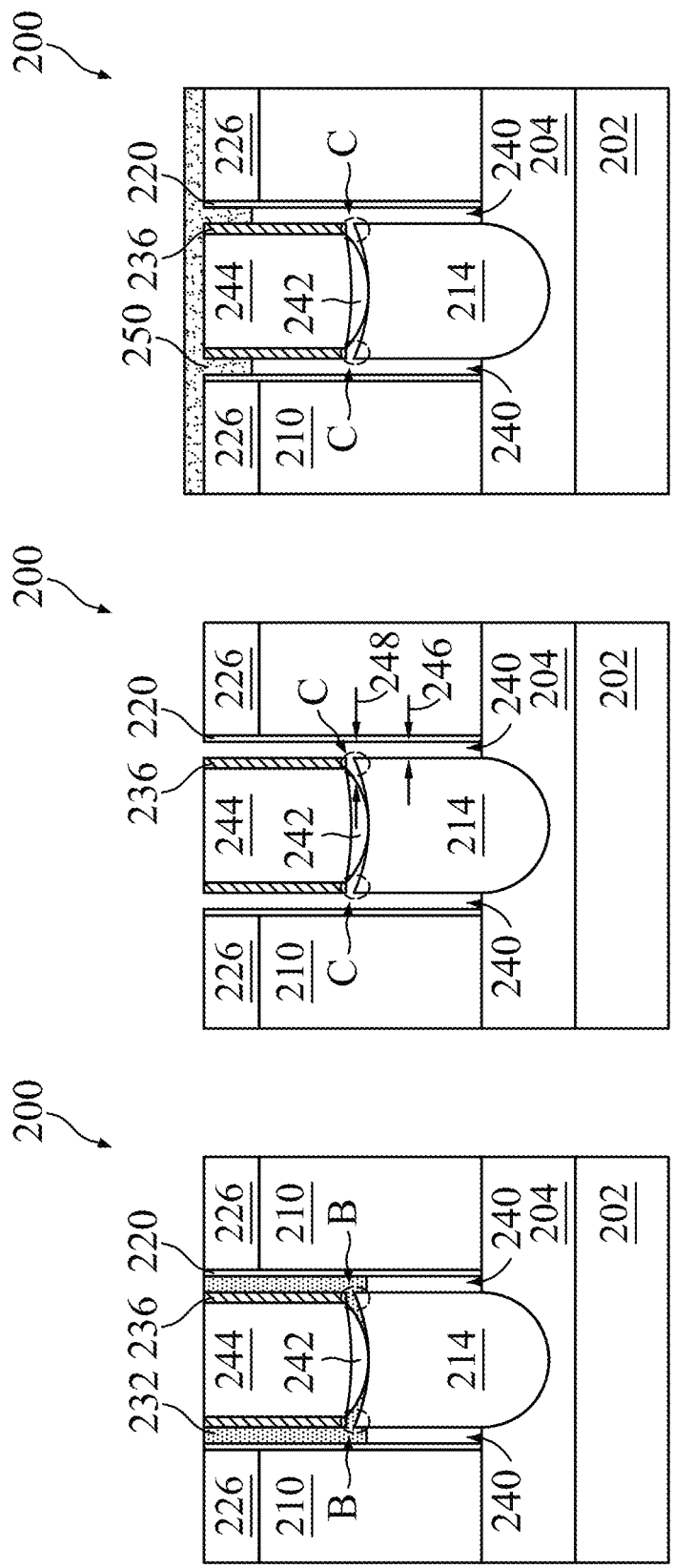

Now referring to FIGS. 1B and 9, method 100 at operation 116 deposits a conductive material in the trench 230 to form an S/D contact 244 over the S/D feature 214 (or the silicide layer 242). The S/D contact 244 may include any suitable conductive material, such as Co, W, Ru, Cu, Al, Ti, Ni, Au, Pt, Pd, other suitable conductive materials, or combinations thereof, and may be formed by any suitable method, such as CVD, ALD, PVD, plating, other suitable processes, or combinations thereof. In the depicted embodiment, the conductive material includes Co. Thereafter, a planarization process, such as CMP, may be performed to remove any excess conductive material, thereby forming the S/D contact 244. In some embodiments, though not depicted, method 100 at operation 116 may also form a barrier layer over the silicide layer 242 in the trench 230 before forming the S/D contact 244. The barrier layer may include a titanium-containing material (e.g., TiN), a tantalum-containing material (e.g., TaN), a tungsten-containing material (e.g., WN), other suitable materials, or combinations thereof. The barrier layer may be formed by any suitable method, such as CVD, ALD, PVD, other suitable methods, or combinations thereof.

Referring to FIG. 1B, method 100 may proceed in one of three embodiments of fabrication processes, all of which are directed to forming an embedded air gap between the HKMG structures 210 and the S/D features 214 (and the S/D contacts 244). The three embodiments are discussed in detail with reference to FIGS. 10A-10B, 11A-11C, and 12A-12G, respectively. These three embodiments are merely examples and are not intended to limit the present disclosure beyond what is explicitly recited in the claims. For example, method 100 may be implemented in any of the three embodiments without departing from the general spirit of the present disclosure, and no one particular embodiment is necessary for implementing method 100. The method flow for the different embodiments are labeled as flows "B", "C", and "D" in FIG. 1B.

Referring to FIG. 1B at flow B and FIG. 10A, method 100 at operation 120 selectively removes the dielectric layer 232 to vertically extend the air gap 240, such that a top portion of the air gap 240 is defined between the gate spacers 220 and the dielectric layer 236 and a bottom portion of the air gap 240 is defined between the gate spacers 220 and the S/D features 214. In some embodiments, method 100 selectively removes the dielectric layer 232 in an anisotropic etching process that may be a dry etching process or a wet etching process, depending upon a composition of the dielectric layer 232. For example, for embodiments in which the dielectric layer 232 includes amorphous silicon, an anisotropic dry etching process may be performed to selectively remove the dielectric layer 232 without removing or substantially removing the gate spacers 220, the dielectric layer 236 (if included in the device 200), the hard mask layer 226, and the S/D contact 244. The anisotropic dry etching process may be implemented using an etchant including a fluorine-containing gas (e.g., $NF_3$, $CF_4$, $SF_6$, $CH_2F_2$, $CHF_3$, and/or $C_2F_6$), hydrogen (i.e., $H_2$), other suitable gases, or combinations thereof. Notably, in order to control the etching selectivity such that only the dielectric layer 232 is substantially etched, various etching parameters, such as etching power, etching bias, and ratios of the gases included in the etchant may be adjusted. For example, a ratio of hydrogen to the fluorine-containing gas included in the etchant may exceed about 30 in order to allow the selective, anisotropic dry etching of the dielectric layer 232. For embodiments in which the dielectric layer 232 includes an aluminum-containing material (e.g., aluminum oxynitride), an anisotropic wet etching process may be performed to selectively remove the dielectric layer 232 without removing or substantially removing the gate spacers 220, the dielectric layer 236 (if included in the device 200), the hard mask layer 226, and the S/D contact 244. The anisotropic wet etching process may be implemented using an etchant such as, for example, 2-anilino-4-methyl-1,3-thiazole-5-carboxylic acid.

Notably, as depicted in FIG. 10A, the etching process at operation 120 removes the portions B from the device 200, thereby forming voids (or air gaps) C over the top surface of the S/D features 214. Stated differently, the silicide layer 242 is only disposed over a portion of the interface between the S/D contacts 244 and the S/D features 214 (i.e., W1<W2 as discussed above). Stated still differently, the dielectric layer 236 is not directly disposed over the top surface of the S/D features 214 but is separated from it by the voids C. In some embodiments, the voids C are formed when the etching process at operation 120 over-etches the portions B of the dielectric layer 232. In some embodiments, a width 246 of the air gap 240 measured between the gate spacers 220 and the S/D features 214 is similar to a width of the gate spacers 222. The voids C may extend the width 246 to a maximum width 248 measured between the gate spacers 220 and the silicide layer 242. In an example embodiment, a ratio of the width 246 to the width 248 is about 1:3. Of course, the present disclosure is not limited to this configuration.

Now referring to FIGS. 1B and 10B, method 100 at operation 122 seals the air gap 240 by forming a seal layer 250 over the top surface of the device 200, partially filling the top portion of the air gap 240 such that it is configured to be an embedded air gap. The seal layer 250 may use any suitable material as long as it allows full enclosure of the air gap 240 to prevent other materials from getting into the air gap 240. The seal layer 250 may include a low-k dielectric material (e.g., a dielectric material having a dielectric constant less than that of silicon oxide), silicon oxide, silicon, silicon nitride, silicon carbonitride, silicon carbide, other suitable materials, or combinations thereof. In some embodiments, the seal layer 250 may have a similar composition as the hard mask layer 226. The seal layer 250 may be deposited by any suitable method, such as CVD, FCVD, ALD, PVD, other suitable methods, or combinations thereof. In the present disclosure, the seal layer 250 may be deposited by a CVD method and deposition parameters (e.g., gas flow rate, gas pressure, ratios of a mixture of gases) may be adjusted to control a thickness of the seal layer 250 being deposited in the air gap 240. In some embodiments, the thickness of the seal layer 250 may range from about 1 nm to about 5 nm.

Now referring to FIG. 1B at flow D and FIG. 11A, method 100 at operation 130 selectively removes the dielectric layer 232 to vertically extend the air gap 240, such that the top portion of the air gap 240 is defined between the gate spacers 220 and the dielectric layer 236 and the bottom portion of the air gap 240 is defined between the gate spacers 220 and the S/D features 214. In the present disclosure, the manner by which method 100 at operation 130 selectively removes the dielectric layer 232 is similar to or the same as that implemented at operation 120, which is discussed in detail above. Referring to FIGS. 1B and 11B, method 100 at operation 132 then selectively removes the dielectric layer 236 from the device 200 to form an air gap 260 along sidewalls of the S/D contact 244. The air gap 260 may be formed by laterally (i.e., in the Y direction) expanding the top portion of the air gap 240, thereby increasing the overall separation and reduce the parasitic capacitance between the HKMG structures 210 and the S/D contact 244. For example, a width 262 of the air gap 260 measured between the gate spacers 220 and the S/D contact 244 is greater than the width 246 as defined previously. In a further example, a ratio of the width 246 to the width 248, and to the width 262 is about 1:2:3. Of course, the present disclosure is not limited to this configuration. The etching process at operation 132 may be implemented by an etching process, such that only the dielectric layer 236 is etched without etching or substantially etching the gate spacers 220, the hard mask layer 226, or the S/D contact 244. The etching process may be a dry etching process (e.g., an ashing process) followed by a wet etching process (e.g., a DHF-based wet etching process) similar to the etching process implemented at operation 106. Thereafter, referring to FIGS. 1B and 11C, method 100 at operation 134 forms the seal layer 250 over the device 200, thereby partially filling the air gap 260 (such that it becomes an embedded air gap) in a manner similar to that discussed above with respect to operation 122.

Figures 12A, 12B, 12C:
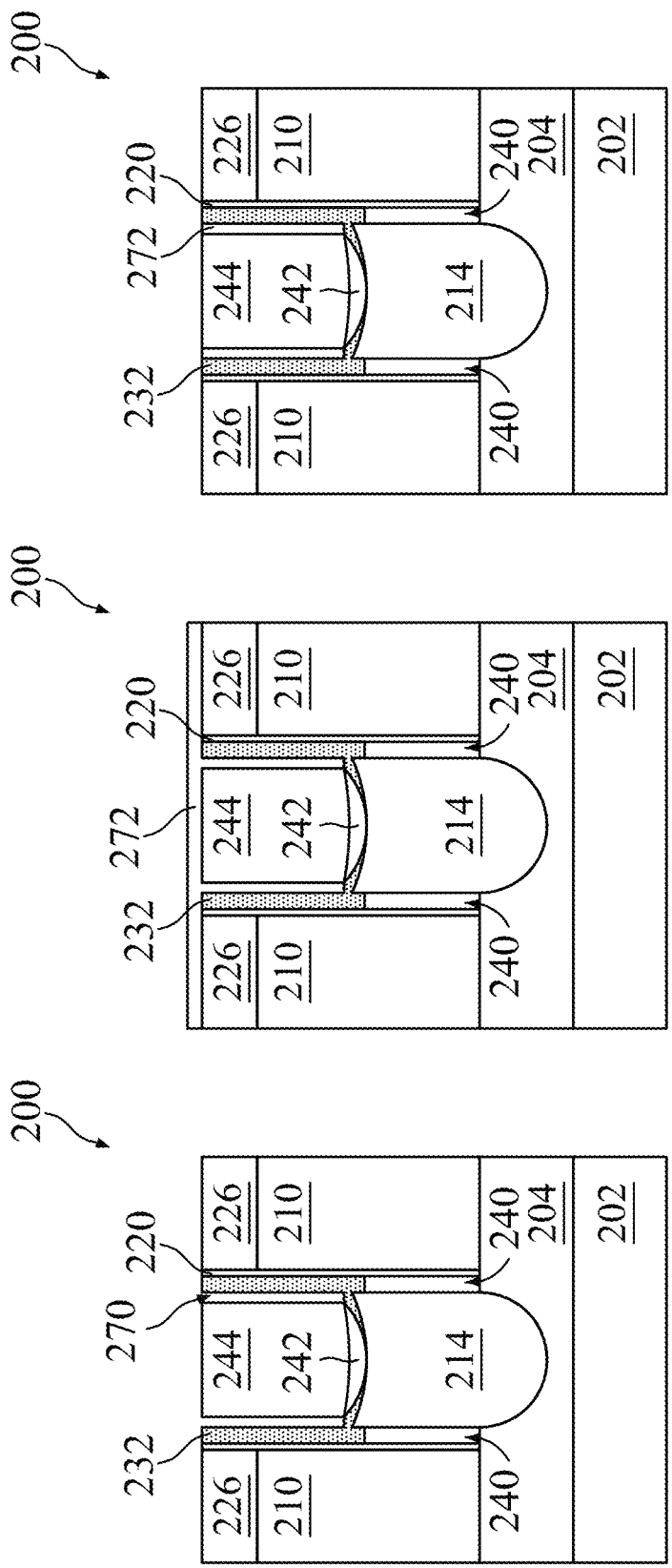

Now referring to FIG. 1B at flow C and FIG. 12A, method 100 at operation 140 selectively removes the dielectric layer 236 to form an air gap 270, which is defined by the dielectric layer 232, the S/D contact 244, and the silicide layer 242. In some embodiments, method 100 selectively removes the dielectric layer 236 in an anisotropic etching process that may be a dry etching process or a wet etching process configured to selectively remove the dielectric layer 236 without removing or substantially removing the gate spacers 220, the dielectric layer 232, the hard mask layer 226, or the S/D contact 244. The etching process may be similar to that discussed above with respect to operation 106 (and operation 132) and may include a dry etching process (e.g., an ashing process) followed by a wet etching process (e.g., a DHF-based wet etching process). Notably, in order to control the etching selectivity such that only the dielectric layer 236 is substantially etched, various etching parameters, such as etching power, etching bias, and ratios of the gases included in the etchant may be adjusted.

Referring to FIGS. 1B and 12B, method 100 at operation 142 deposits a dielectric layer 272 in the air gap 270 as well as over the top surface of the device 200. Importantly, the dielectric layer 272 includes a dielectric material different from the dielectric layer 232 and dielectric layer 236, as well as the gate spacers 220 and the hard mask layer 226. In some embodiments, the dielectric layer 272 includes a dielectric material having a dielectric constant less than that of the dielectric layer 236, such that an etching selectivity exists between the dielectric layer 236, the gate spacers 220, the hard mask layer 226, and the dielectric layer 272 when subjected to a common etchant. In some embodiments, the dielectric layer 272 includes a low-k dielectric material, i.e., a dielectric material having a dielectric constant less than that of silicon oxide. Examples of low-k dielectric material may include fluorine-doped silicon oxide, organosilicate glass, porous silicon oxide, spin-on glass, other suitable materials, or combinations thereof. In one such example, the dielectric layer 236 may include a nitride material, while the dielectric layer 272 may include a dielectric material having a dielectric constant less than that of the nitride material included in the dielectric layer 236, such as an oxide material. In another example, the dielectric layer 272 may include a porous material, such as fluorine-doped silicon oxide, carbon-doped silicon oxide, other suitable materials, or combinations thereof. The dielectric layer 272 may be formed by any suitable method, such as CVD, FCVD, ALD, PVD, SOG, other suitable methods, or combinations thereof. Thereafter, referring to FIG. 12C, method 100 at operation 142 removes portions of the dielectric layer 172 formed over the top surface of the device 200 by a planarization process, such as CMP.

Figures 12D, 12E:
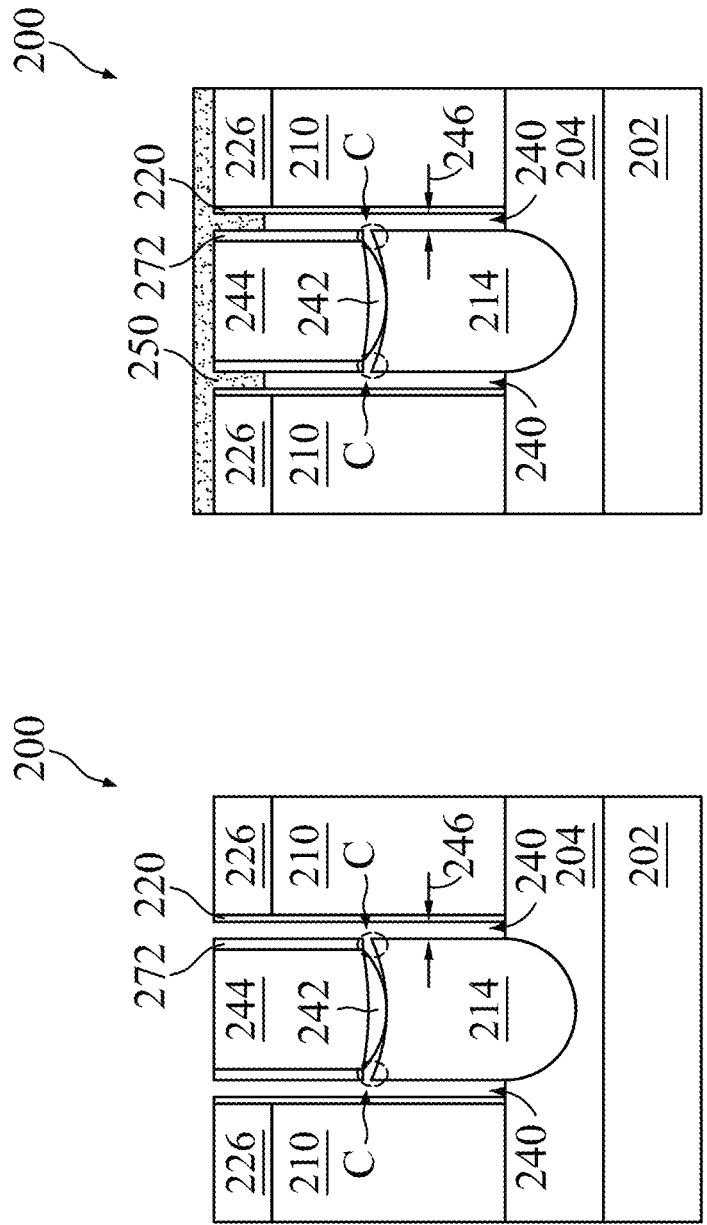

Referring to FIGS. 1B and 12D, method 100 at operation 144 selectively removes the dielectric layer 232 to vertically extend the air gap 240, such that the top portion of the air gap 240 is defined between the gate spacers 220 and the dielectric layer 272 and the bottom portion of the air gap 240 is defined between the gate spacers 220 and the S/D features 214. In some embodiments, the manner in which the dielectric layer 232 is selectively removed is similar to that discussed above with respect to operation 120, except that the etching process at operation 144 also considers etching selectivity between the dielectric layer 232 and the dielectric layer 272, in addition to that between the dielectric layer 232 and the gate spacers 220, the hard mask layer 226, and the S/D contact 244. As defined previously, the removal of the dielectric layer 232 defines the width 246 of the air gap 240. In other words, the separation between the S/D contact 244 and the HKMG structures 210 as depicted in FIGS. 12D and 12E is defined by a width of the dielectric layer 232, which is removed to extend the air gap 240. In addition, the voids C, which are similar to those discussed in detail above with respect to FIGS. 10A and 11A, are formed between portions of the silicide layer 242 and the S/D features 214 after the dielectric layer 232 is removed. Referring to FIG. 12E, method 100 at operation 146 forms the seal layer 250 over the device 200, thereby partially filling the air gap 240 in a manner similar to that discussed above with respect to operation 122.

Figure 12G:
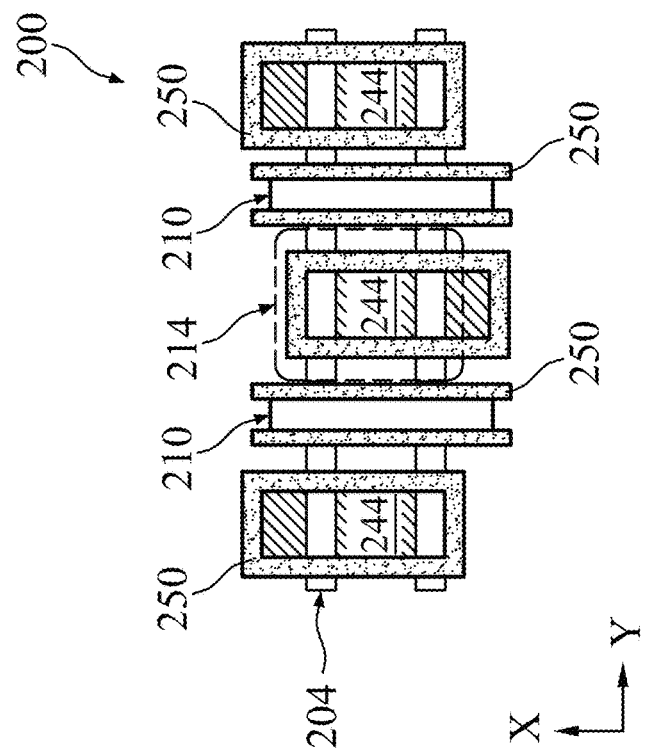
FIG. 12G is a top view of the semiconductor device shown in FIGS. 2A and 2B during intermediate stages of the method shown in FIGS. 1A and 1B, according to various embodiments of the present disclosure.
Figure 12F:
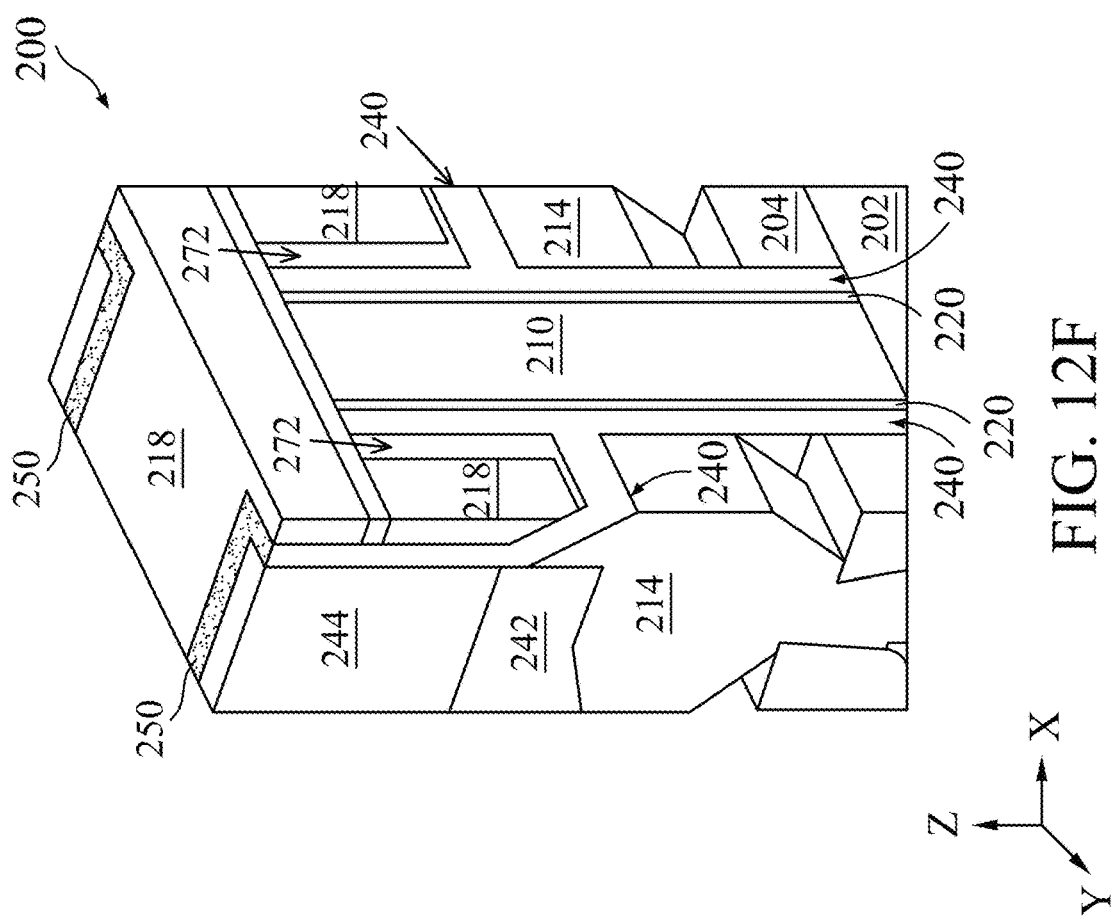
FIG. 12F is a perspective view.

FIG. 12F provides a perspective view and FIG. 12G provides a top view of the device 200 after forming the seal layer 250. It is noted that in FIGS. 12F and 12G, the air gap 240 cannot be seen from at the top surface of the device 200 because of the presence of the seal layer 250.

Although not intended to be limiting, one or more embodiments of the present disclosure provide many benefits to a semiconductor device and the formation thereof. For example, the present disclosure provides some embodiments configured to increase a volume of an embedded air gap surrounding metal gate structures and S/D contacts, thereby reducing parasitic capacitance between these components during device operation. In some embodiments, volume of air gap between the metal gate structures and S/D contacts is expanded by first forming sacrificial dielectric layer(s) (e.g., the dielectric layers 232 and/or the dielectric layer 236) in a contact trench (e.g., contact hole) and then removing them by selective etching process(es) after forming the S/D contact in the contact trench. Forming the air gap after forming the contact trench and subsequently the S/D contact could prevent any unintentional re-opening of the air gap that may occur during the formation of the contact trench due to, for example, lithography overlay errors. In some embodiments, additional air gap volume between the S/D contacts and underlying S/D features are incorporated into the device structure. Because the S/D contacts' routing area is more expansive than the metal gates in a circuit layout, including a greater volume of air gap surrounding the S/D contacts may be an efficient way to reduce the overall parasitic capacitance of the device. In addition, besides utilizing air as an insulating medium, low-k dielectric materials combined with air is also used as the insulating medium between the metal gates and the S/D contacts in some embodiments of the present disclosure, which serves to lower the overall dielectric constant of the insulating medium when compared with high-k dielectric materials typically used in FETs. Embodiments of the disclosed methods can be readily integrated into existing manufacturing processes and technologies, such as middle end of line (MEOL) and back end of line (BEOL) processes.

Thus in one embodiment, a method is provided for forming a device. The method includes forming a trench that exposes a source/drain (S/D) feature, wherein the S/D feature is separated from a metal gate structure (MG) by a gate spacer. The method further includes removing the gate spacer to form an air gap and forming a first dielectric layer in the trench, wherein the first dielectric layer partially fills the air gap. The method also includes forming a second dielectric layer over the first dielectric layer, wherein the second dielectric layer is different from the first dielectric layer and forming a S/D contact over the S/D feature and the second dielectric layer. After forming the S/D contact, the first dielectric layer is removed to extend the air gap; and after removing the first dielectric layer, a third dielectric layer is formed to seal the air gap.

In another embodiment, the method includes providing a semiconductor device including a metal gate structure (MG), a gate spacer disposed on a sidewall of the MG, and a source/drain (S/D) feature disposed adjacent to the gate spacer. The method further includes forming a contact trench over the S/D feature, removing the gate spacer to form an air gap between the MG and the S/D feature, depositing a first dielectric layer over the S/D feature that partially fills the air gap, depositing a second dielectric layer over the first dielectric layer, forming a silicide layer over the S/D feature, and forming an S/D contact over the silicide layer. After forming the S/D contact, the second dielectric layer is replaced with a third dielectric layer, wherein the third dielectric layer is different from the second dielectric layer. The method still further includes removing the first dielectric layer to extend the air gap and depositing a seal layer over the air gap and the third dielectric layer.

In yet another embodiment, a semiconductor structure is provided, including a source/drain (S/D) feature disposed between metal gate structures (MGs), wherein the S/D feature is separated from the MGs by a first air gap. The structure further includes a S/D contact disposed over the S/D feature, wherein sidewalls of the S/D contact are separated from the MGs by the first air gap, and wherein portions of a bottom surface of the S/D contact are separated from a top surface of the S/D feature by a second air gap, and a dielectric layer disposed over the first air gap.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a workpiece including a metal gate structure (MG), a first gate spacer disposed along a sidewall of the MG, a second gate spacer disposed along a sidewall of the first gate spacer, and a source/drain (S/D) feature disposed adjacent to the second gate spacer;
   forming a contact trench over the S/D feature;
   removing the second gate spacer to form an air gap between the MG and the S/D feature;
   depositing a first dielectric layer over the S/D feature and partially filling the air gap;
   removing a first portion of the first dielectric layer to expose a central portion of a top surface of the S/D feature, wherein a side portion of the top surface of the S/D feature remains under the first dielectric layer;
forming an S/D contact in the contact trench;
removing at least a second portion of the first dielectric layer to extend the air gap; and
depositing a second dielectric layer over the air gap.

2. The method of claim 1, wherein the workpiece further includes an etch stop layer (ESL) disposed over the S/D feature and along a sidewall of the second gate spacer,
wherein removing the second gate spacer to form the air gap further removes a portion of the ESL disposed along the sidewall of the second gate spacer.

3. The method of claim 1, wherein the first dielectric layer includes a first sublayer and a second sublayer disposed over the first sublayer,
wherein the first sublayer partially fills the air gap, and
wherein removing the first portion of the first dielectric layer removes the first portion from both the first sublayer and the second sublayer.

4. The method of claim 3, wherein removing at least the second portion of the first dielectric layer to extend the air gap includes removing the first sublayer or removing both the first sublayer and the second sublayer.

5. The method of claim 3, wherein removing at least the second portion of the first dielectric layer to extend the air gap includes:
replacing the second sublayer with a third dielectric layer, and
removing the first sublayer.

6. The method of claim 3, wherein the second sublayer includes a greater amount of nitrogen than the first sublayer.

7. The method of claim 1, wherein forming the S/D contact in the contact trench includes:
forming a silicide layer in a bottom of the trench, wherein the silicide layer contacts the central portion of the top surface of the S/D feature, and
forming the S/D contact over the silicide layer.

8. The method of claim 1, wherein depositing the second dielectric layer over the air gap includes partially filling the air gap with the second dielectric layer.

9. A method, comprising:
providing a workpiece including a metal gate structure (MG), a source/drain (S/D) feature disposed adjacent to the MG, a dielectric structure disposed over the S/D feature, and a gate spacer disposed between the S/D feature and the MG and between the dielectric structure and the MG;
forming a trench in the dielectric structure and exposing the S/D feature;
removing a portion of the gate spacer to form an air gap between the MG and the S/D feature;
depositing a first dielectric layer over the S/D feature, the MG, and a remaining portion of the gate spacer;
removing a portion of the first dielectric layer to expose a first portion of a top surface of the S/D feature, wherein a second portion of the top surface of the S/D feature remains unexposed;
forming an S/D contact in the trench;
removing the first dielectric layer; and
depositing a second dielectric layer in a top portion of the air gap.

10. The method of claim 9, wherein forming the S/D contact in the trench includes:
forming a silicide layer in a bottom of the trench, and
forming the S/D contact over the silicide layer in the trench.

11. The method of claim 10, after forming the silicide layer in the bottom of the trench, further comprising removing a top portion of the first dielectric layer to form a rounded profile of the first dielectric layer.

12. The method of claim 9, wherein depositing the first dielectric layer includes partially filling the air gap with the first dielectric layer.

13. The method of claim 9, wherein the portion of the first dielectric layer is a first portion of the first dielectric layer,
wherein removing the first dielectric layer includes removing a second portion of the first dielectric layer from a sidewall of the MG.

14. The method of claim 13, wherein removing the first dielectric layer further includes removing a third portion of the first dielectric layer from a sidewall of the S/D contact.

15. The method of claim 9, wherein the portion of the first dielectric layer is a first portion of the first dielectric layer and the air gap is a first air gap,
wherein removing the first dielectric layer includes removing a second portion of the first dielectric layer from a sidewall of the S/D contact to leave a second air gap,
depositing a third dielectric layer in the second air gap, and
removing a third portion of the first dielectric layer from a sidewall of the MG.

16. A semiconductor structure, comprising:
a semiconductor fin;
a source/drain (S/D) feature disposed over the semiconductor fin;
a contact structure disposed over the S/D feature, wherein the contact structure has a continuous bottom surface, wherein a first portion of the continuous bottom surface interfaces with the S/D feature; and
an air gap disposed between a second portion of the continuous bottom surface of the contact structure and a top surface of the S/D feature.

17. The semiconductor structure of claim 16, wherein the air gap is a first air gap,
wherein the semiconductor structure further comprises a second air gap disposed along sidewalls of the S/D feature and the contact structure, and
wherein the first air gap and the second air gap are connected.

18. The semiconductor structure of claim 17, further comprising a spacer layer disposed along a sidewall of the contact structure,
wherein a sidewall of the spacer layer is exposed to the second air gap.

19. The semiconductor structure of claim 16, further comprising:
a metal gate structure adjacent to the S/D feature; and
a gate spacer disposed between the contact structure and the metal gate structure and between the S/D feature and the metal gate structure.

20. The semiconductor structure of claim 16, wherein the contact structure includes a silicide layer and an S/D contact disposed over the silicide layer.

* * * * *